United States Patent [19]

Adlerstein

[11] Patent Number: 5,126,701

[45] Date of Patent: Jun. 30, 1992

[54] AVALANCHE DIODE LIMITERS

[75] Inventor: Michael G. Adlerstein, Wellesley, Mass.

[73] Assignee: Raytheon Company, Lexington, Mass.

[21] Appl. No.: 638,730

[22] Filed: Dec. 28, 1990

[51] Int. Cl.$^5$ .............................................. H01P 5/04
[52] U.S. Cl. ..................................... 333/172; 333/247
[58] Field of Search ....................... 333/104, 17.2, 164,
333/81 A, 262

[56] References Cited

U.S. PATENT DOCUMENTS

| | | | |
|---|---|---|---|
| 3,775,708 | 11/1973 | Sly | 333/81 A |
| 4,097,827 | 6/1978 | Williams | 333/81 A X |
| 4,232,278 | 11/1980 | Gawronski et al. | 333/17.2 X |
| 4,357,583 | 11/1982 | Martel et al. | 333/17.2 |
| 4,527,136 | 7/1985 | Kamiya | 333/104 X |
| 4,754,240 | 6/1988 | Marconi | 333/81 A X |
| 4,810,980 | 3/1989 | Heston et al. | 333/81 A X |

*Primary Examiner*—Paul Gensler
*Attorney, Agent, or Firm*—Denis G. Maloney; Richard M. Sharkansky

[57] ABSTRACT

An RF limiter circuit having an input terminal and an output terminal includes an RF propagation network having a first end coupled to the input terminal of the circuit and a second end coupled to the output terminal of the circuit. The RF limiter circuit further includes a plurality of diodes, each diode having an anode and a cathode with the anode of a first one of the diodes coupled to the RF propagation network and the cathode of a second one of the diodes coupled to the RF propagation network. The limiter circuit further includes a bias network for distributing a reverse bias voltage across each of the plurality of diodes and for providing a DC voltage on said RF propagation network.

17 Claims, 7 Drawing Sheets

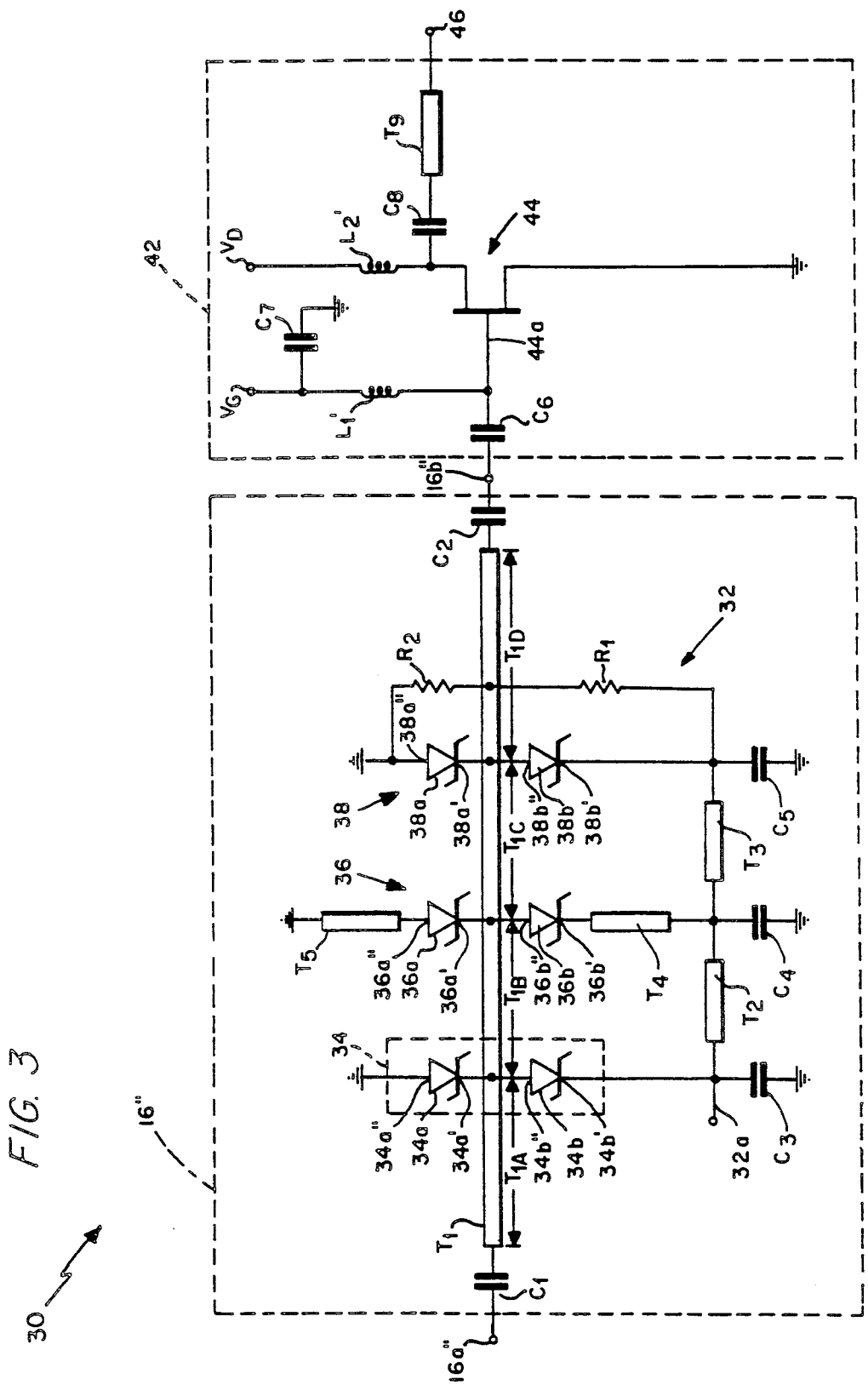

AVALANCHE DIODE LIMITERS

BACKGROUND OF THE INVENTION

This invention relates generally to radio frequency circuits and more particularly to radio frequency limiters.

As is known in the art, in radio frequency systems there exists a trend towards miniaturization and integration of RF components and circuits by use of monolithic microwave and millimeter wave integrated circuit technologies. Such components, including amplifiers, mixers, switches and the like, are finding uses in RF receiving systems. In a typical receiver, the receiver includes a so-called "RF front end" which generally has an antenna coupled to a low noise amplifier. The amplifier generally is fed to an RF mixer which feeds a detector circuit.

It is also known in the art that RF receivers such as those used in radar systems for example typically operate in environments which pose a multiplicity of electromagnetic hazards. In such an environment high RF input signal levels provided by leakage from the radar's transmitter or from hostile jammers for example, pose a threat to those circuit components of a receiving system which are susceptible to burn out as a result of a high incident power level. For example, the low noise amplifier used in the "front end" of a radar receiver generally includes at least on field effect transistor which is succeptable to damage due to high incident power levels.

One type of transistor commonly used in monolithic microwave integrated circuits in the so-called MESFET (metal semiconductor field effect transistor). The MESFET includes source and drain electrodes which are disposed to make ohmic contact to a semiconductor channel region. Disposed in Schottky barrier contact with the channel region and between said source and drain electrodes is a gate electrode. The gate electrode is used to control the electrical conductivity of the channel region between the source and drain electrodes as is commonly known. For high frequency devices such as millimeter wave devices, the gate electrode has a fairly short "gate length" typically of less than 0.25 microns. Even for lower frequency operations such as at microwave frequencies, the gate length is short, (i.e., less than about 1 micron). Because of these small gate lengths, the MESFET is particularly vulnerable to burnout from high level microwave and millimeter wave input signals fed to the gates of the MESFET. This is particularly true for a circuit at the front end of the receiver where the input power level may not be controllable due to the aforementioned electromagnetic hazards. Therefore, such circuits need to be protected from high input power levels.

One approach used in an RF receiver is a PIN-diode limiter circuit. One type of PIN-diode RF limiter circuit is described in a paper entitled "Dual-Diode Limiter for High-Power/Low-Spike Leakage Applications" by R. J. Tan et al., published in IEEE MTT-S, Vol. II, 1990, Page 757. This article describes a limiter having a transmission line with a first end coupled to an input terminal and a second end coupled to an output terminal and at least one, preferably two or more, PIN diodes mounted in shunt between the transmission line and a reference potential. Performance is enhanced when two diodes are placed with opposite polarities a quarter wavelength apart along the transmission line. The limiter operates in two basic modes. While operating in its normal, non-limiting mode, the limiter has a relatively low insertion loss. While operating in a limiting mode however, the PIN diodes ar placed in a forward biased conductive state and as a result the limiter should present a very high insertion loss characteristic to input power signals fed thereto. The limiter is placed between the input signal source such as the antenna for example, and the circuit which needs protection such as the low noise amplifier.

Several problems exist with the PIN diode limiter approach. In general, a PIN diode is a diode having a doping profile that contains a positive doped region (P) spaced from a negative doped region (N) by an intrinsic region (I). A thin I region and a large junction area are necessary for maximum power handling capability when the PIN diode is in its limiting state. A thin I region is also desired to insure rapid recovery from the limiting state to the non-limiting state. On the other hand, a thin I region results in a high capacitance for a given device area thereby increasing insertion loss in the non-limiting state Therefore, a compromise value for I layer thickness must be found.

The PIN diode is used as an RF limiter by applying power to the diode such that both the NI junction and the PI junction are forward biased. Under such a forward bias condition, the I region appears to be n-type material relative to the P material and the I region appears to be P type material relative to the N material. Therefore, the PI and IN junctions behave like two PN junctions. Under forward bias conditions, carriers are injected onto the I region from both the N and P regions. Carriers remain in the I region until hole-electron pairs are formed in a process referred to as recombination. Charge continues to flow into the I region as long as the PI and IN junctions are forward biased. This condition makes the diode appear to be a low resistance path between its terminals. When used as an RF limiter, the PIN diode is coupled between a signal line and ground. Thus, an applied RF input signal is limited if the power level of said input signal is large enough to forward bias the PI and NI junctions of the PIN diodes. Under these conditions the excess power is shunted to ground since the low resistance path between the terminals of the PIN diode is between the RF transmission line and ground. When the applied input signal is below the excess power level, the PI and NI junctions are no longer forward biased and the charge in the PI and NI junctions is removed primarily by the process of recombination of holes and electrons as mentioned above. This process of recombination, causes the PIN diodes to switch from their conducting state to their non-conducting state. The time which is required to switch the PIN diodes from their conducting state to their non-conducting state (i.e. recovery time as described above) slows as junction temperatures increase. Therefore recovery time of a PIN diode is temperature sensitive. Junction temperatures may increase due to the heating which occurs as power is dissipated in the PIN diodes or by a rise in the ambient temperature of the environment in which the limiter is operating.

A further problem is that PIN diode limiters are not easily fabricated as monolithic microwave integrated circuits particularly being integrated with a field effect transistor (FET) on a common semiconductor substrate.

Accordingly, it would be desirable to provide an RF limiter circuit which has the capability to operate as a high speed, high power limiter, having a low insertion loss in the non-limiting state and which can operate up to and including the millimeter wave frequency band.

Furthermore, it would be desirable to provide these same electrical characteristics in an RF limiter circuit which is compatible with monolithic microwave integrated circuit (MMIC) fabrication processes which would permit such circuits to be fabricated as MMICs and further which would permit such a limiter to be integrated on a common semiconductor substrate with the circuit it is being used to protect.

SUMMARY OF INVENTION

In accordance with the present invention, an RF limiter circuit having an input terminal and an output terminal, includes an RF propagation network having a first end coupled to the input terminal of the circuit and a second end coupled to the output terminal of the circuit. The RF limiter circuit further includes a pair of diodes with each diode of said pair having an anode and a cathode, with the anode of a first diode of said diode pair coupled to said propagation network and the cathode of a second diode of said diode pair coupled to said propagation network. The RF limiter circuit further includes bias means coupled to said propagation network and said diodes for distributing a reverse bias voltage across each of said diodes and for providing a reference voltage on said propagation network. With this particular arrangement, a high frequency RF limiter circuit is provided. By using reverse biased diodes in the limiter, the limiter will have low insertion loss characteristics in its non-limiting mode because the reverse bias voltage applied by the bias means causes the diode capacitance to be very low. This leads to low insertion loss particularly at high frequencies. In its limiting mode, RF voltage added to the reverse DC bias voltage and RF voltages cause the diode to be placed in a condition of avalanche breakdown. Diodes do not recover from avalanche breakdown due to the process of electron-hole pair recombination as in the PIN diode. Rather, the presence of a large electric field across the diode junction provided as a result of the removal of the avalanche breakdown voltage, causes charge to be rapidly swept across the junction. This process of avalanche recovery is less temperature sensitive than the prior PIN diode process of electron-hole pair recombination. Thus limiters using reverse biased diodes are less temperature sensitive than PIN diode limiters.

In accordance with a further aspect of the present invention, an RF limiter having an input terminal and an output terminal includes an RF propagation network having a first end coupled to the input terminal of the circuit and a second end coupled to the output terminal of the circuit. The RF limiter further includes a plurality of diode pairs with each diode of said pairs having an anode and a cathode. Each pair has the anode of a first diode of said diode pair coupled to said propagation network and the cathode of a second diode of said diode pair coupled to said propagation network. The plurality of diode pairs are spaced along said propagation network by a predetermined electrical pathlength. The RF limiter circuit further includes bias means coupled to said propagation network and said plurality of diode pairs for distributing a reverse bias voltage across each of said diode pairs and for providing a reference voltage on said propagation network. With this particular arrangement, by using a plurality of diode pairs spaced by a predetermined electrical path length along a RF transmission line, a broadband RF limiter circuit which is able to handle high power levels is provided. The limiter is capable of handling higher power than a single diode pair limiter since the power is distributed throughout the plurality of diode pairs.

In accordance with a still further aspect of the present invention, a method of fabricating an RF limiter circuit as a monolithic microwave integrated circuit on a common substrate having an active component as a circuit to be protected by the limiter includes the steps of providing two different semiconductor layers over a semi-insulating substrate. A first one of said semiconductor layers is an active layer which provides regions for fabrication of diode pairs. A second one of said semiconductor layers is an active layer which provides regions for fabrication of the active component to be protected. The first and second active layers are spaced by a semiconductor etch stop layer to permit individual fabrication of each said first and second active layers. With such an arrangement, a RF limiter circuit and a circuit component to be protected, as for example a field effect transistor, may be fabricated over the same substrate, thus providing an all monolithic circuit having increased reliability, decreased size and decreased cost.

BRIEF DESCRIPTION OF THE DRAWINGS

The foregoing features of this invention, as well as the invention itself, may be more fully understood from the following detailed description of the drawings in which;

FIG. 3 is a detailed schematic of a distributed RF limiter circuit protecting a field effect transistor;

DESCRIPTION OF THE PREFERRED EMBODIMENTS

Figure 1:
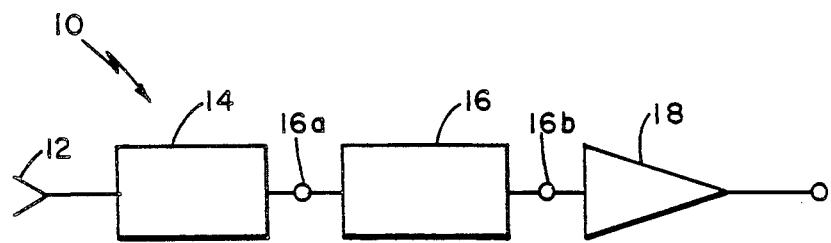
FIG. 1 is a block diagram of a typical RF receiving system.

Referring now to FIG. 1, a circuit protected from a high input power level such as a front end 10 of a radar system is shown to have an optional filter 14, fed by an input signal here from an antenna 12. The filter feeds an appropriately filtered input signal to an RF limiter 16. The RF limiter 16, as will be further discussed in conjunction with FIGS. 2-16, feeds such filtered RF input signal to a circuit such as a low noise amplifier 18. The limiter 16 is provided to couple the RF signals to the low noise amplifier (LNA) 18 with minimum loss unless the input signal level to the LNA 18 exceeds a certain predetermined threshold. In this instance, the limiter is switched into its limiting state and acts to attenuate the signal being fed to the LNA 18 to protect the LNA 18. An LNA is generally known to be made up of one or more field effect transistors (FETs). The FET such as a metal electrode semiconductor field effect transistor (MESFET) includes a pair of source and drain electrodes in ohmic contact to a channel region and spaced by a thin gate electrode in Schottky barrier contact to the channel region. The gate controls the conductance of the channel between source and drain electrodes. The field effect transistor is in particular the active device requiring protection due to the susceptibility of the gate electrode to damage from high power input signal levels. A diode is another example of an active device which may also require protection. In different applications, other components such as mixers, phase shifters, switches or the like may require protection.

Therefore, the RF limiter circuit 16 could be used to protect any component in a circuit which has an active device such as field effect transistor or a diode.

Figure 2:
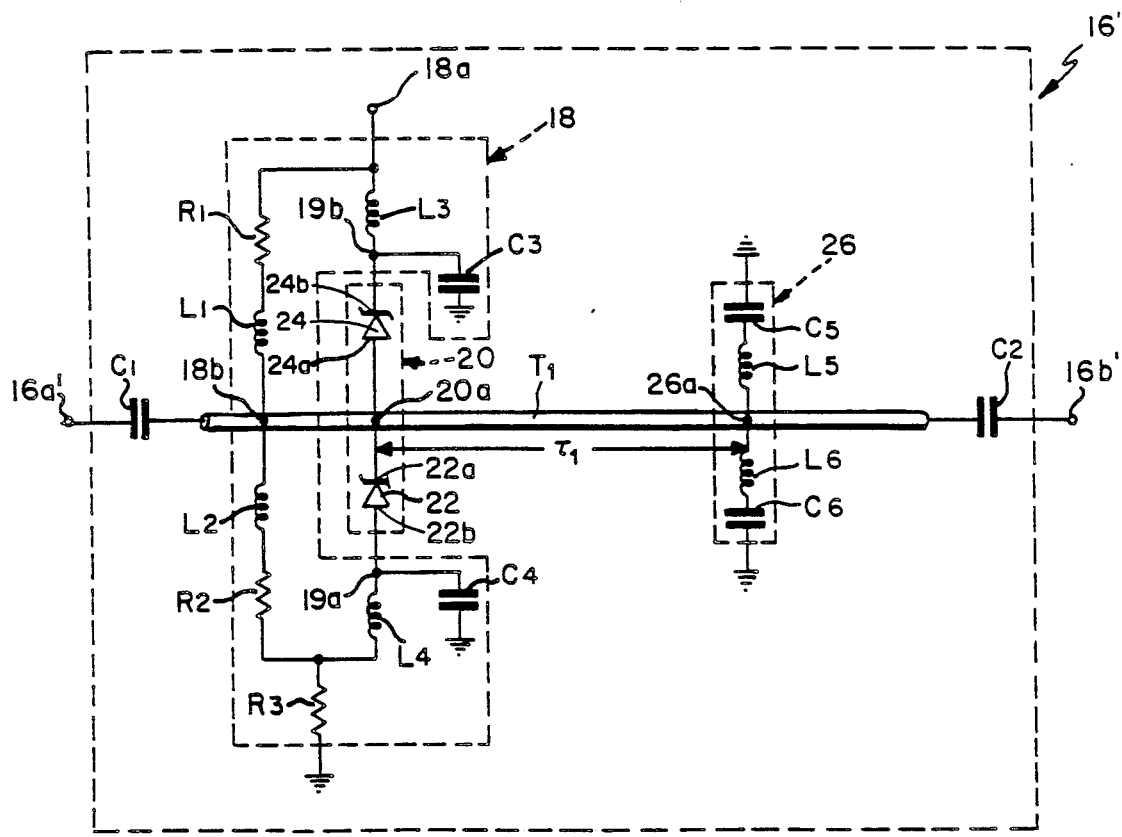
FIG. 2 is a detailed schematic of first embodiment of a RF limiter circuit.

Referring now to FIG. 2, a first embodiment 16' for the RF limiter circuit 16 (FIG. 1) has an input terminal 16a' and an output terminal 16b'. A first electrode of a first DC blocking capacitor C1 is coupled to the input terminal 16a'. A second electrode of capacitor C1 is coupled to a first end of a RF propagation network T1, here a microstrip transmission line. A second end of the microstrip transmission line, T1, is coupled to a first electrode of a second DC blocking capacitor C2. A second electrode of DC blocking capacitor C2 is coupled to the output terminal 16b'. A bias network 18 has a bias voltage input terminal 18a, and a first DC path to ground including a resistor R1 serially connected to an inductor L1 having on end coupled to the microstrip transmission line T1 and the resistor R1 having one end coupled to terminal 18a as shown. The first path to ground further includes an inductor L2 which is serially connected to resistor R2 as shown. A resistor R3 is serially connected between resistor R2 and ground as shown. A first RF path to ground is provided from node 19a. Inductor L3 has a first electrode connected to terminal 18a and a second electrode connected to a first electrode of capacitor C3 at node 19b. A second electrode of capacitor C3 is connected to ground. At high RF frequencies the impedance of inductor L3 approaches that of an RF open circuit and the impedance of capacitor C3 approaches that of an RF short circuit. Thus, a first RF path to ground is provided from terminal node 19b through serially connected inductor L3 and capacitor C3 as shown. A second RF path to ground is provided via serially connected inductor L4 and capacitor C4. Inductor L4 has a first electrode coupled to a node 19a of bias network 18 and a second electrode coupled a first electrode of a resistor R3. A capacitor C4 has a first electrode coupled to the node 19a. A second electrode of capacitor C4 is connected to ground thus providing a second RF path to ground as shown. The limiter is shown to further include a diode pair 20 coupled between nodes 19a and 19b of the bias network 18. The diode pair 20 is also coupled to transmission line T1 as shown. Here the diode pair 20, includes a first diode 22 having an anode 22a coupled to node 19a and a cathode 22b coupled to RF propagation network T1 as shown. Diode pair 20 further includes a second diode 24 having anode 24a coupled to transmission line T1 and cathode 24b coupled to node 19b. With this configuration of bias network 18 and diode pair 20, a reverse bias voltage, $V_R$, is provided to each diode of said diode pair and a reference voltage is provided on said RF propagation network T1.

The limiter 16' further includes a tuning network 26 coupled between the microstrip transmission line T1 and ground. A predetermined electrical path length $\tau_1$ from point 20a to point 26a along transmission line T1 is chosen based on the operational impedance characteristics of diode pair 20. Here, tuning network 26 includes an inductor L5 and capacitor C5 connected in series between transmission line T1 at node 26a and ground as shown. Tuning network 26 further includes inductor L6 and capacitor C6 connected serially between transmission line T1 at node 26a and ground as shown. Here the values of inductor L5, L6 and capacitors C5, C6 are chosen in conjunction with the impedance values of diode pair 20 to provide low insertion loss in limiter 16' while the limiter is operating in the non-limiting mode. The two series paths in parallel from node 26a to ground could be equivalently represented as a single series path having one inductor and one capacitor. Here two parallel paths are chosen because of the relative difficulty in fabricating small values of inductances in monolithic microwave integrated circuits.

In a preferred embodiment, the diodes are chosen to be fast recovery diodes, such as Schottky barrier diodes.

Figure 2A:
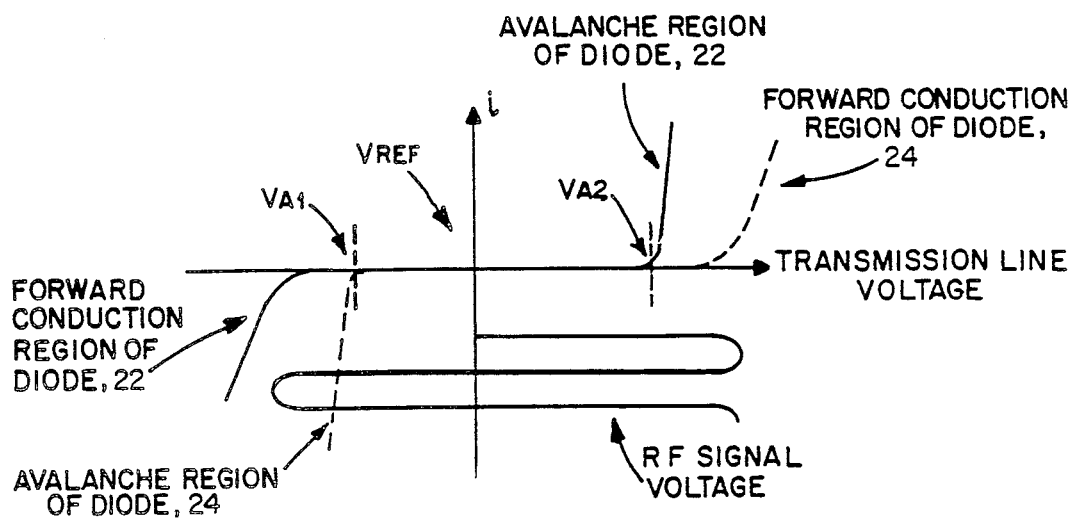
FIG. 2A is a plot of current vs. voltage showing the relationship of input voltage signal level to avalanche breakdown voltage and current conduction during avalanche.

The operation of RF limiter circuit 16' will be described in conjunction with FIG. 2A. FIG. 2A represents the current and voltage relationship in the pair of diodes 22 and 24 (FIG. 2). As previously described, a reference voltage $V_{REF}$ is provided on transmission line T1 (FIG. 2) by bias network 18 (FIG. 2). The reference voltage $V_{REF}$ is selected by the bias voltage applied by the biasing network 18 (FIG. 2). The reference voltage, $V_{REF}$, is selected such that neither diode 22 nor diode 24 (FIG. 2) is ever driven into forward conduction during either negative or positive portions of the RF signal cycle. That is, the reference voltage, $V_{REF}$, is selected to ensure that avalanche breakdown will occur in the diodes 22, 24 (FIG. 2) before forward conduction can occur in the diodes.

When an RF signal is fed to terminal 16a' (FIG. 2), the signal propagates along the transmission line T1 (FIG. 2). The voltage across the diodes 22 and 24 (FIG. 2) coupled to the transmission line T1 (FIG. 2), varies above and below the reference voltage $V_{REF}$ on the transmission line T1 (FIG. 2). If the amplitude of the RF signal voltage at one of the diodes, combined with the reference voltage $V_{REF}$ at the diode, exceeds the voltage which would cause avalanche breakdown to occur in the diode (i.e. $V_{A1}$ or $V_{A2}$), then DC and RF current would flow in the diode thereby limiting the voltage on transmission line T1 (FIG. 2).

Referring now to FIG. 3, a protected low noise amplifier 30 is shown to include an RF limiter circuit 16" coupled to a low noise amplifier 42. Low noise amplifier 42 includes a field effect transistor (FET) 44. RF limiter circuit 16" has an input terminal 16a", and an output node 16b". A first electrode of a first DC blocking capacitor C1 is coupled to the input terminal 16a". A second electrode of capacitor C1 is coupled to a first end of a RF propagation network T1, here a microstrip transmission line. A second end of the microstrip transmission line, T1, is coupled to a first electrode of a second DC blocking capacitor C2. A second electrode of DC blocking capacitor C2 is coupled to the output node 16b". A bias network 32 has a bias voltage input terminal 32a, a DC path to ground including a first transmission line T2 serially connected to a second transmission line T3 having one end coupled to a first end of resistor R1 and the resistor R1 having a second end coupled to the microstrip transmission line T1, as shown. The DC path to ground further includes a resistor R2 which is serially connected between transmission line T1 and ground as shown. Here distributed inductors are provided by transmission lines T2 and T3 which serve to isolate the three RF frequency paths to ground which are provided by capacitors C3, C4 and C5 as shown.

A plurality of diode pairs 34-38 are coupled along the transmission line T1 as shown, transmission line T1 being made up of sections $T_{1A}$-$T_{1D}$. The plurality of diode pairs are coupled to the transmission line and spaced by predetermined electrical pathlengths $T_{1A}$, $T_{1B}$, $T_{1C}$ and $T_{1D}$ along the transmission line. The electrical pathlengths $T_{1A}$-$T_{1D}$ between the diode pairs 34-38 are chosen in conjunction with the operating impedance of the diode pairs 34-38 and the low noise amplifier 42. The electrical pathlengths $T_{1A}$-$T_{1D}$ are chosen to provide selected input and output impedance values at terminals 16a'' and 16b' as would be appreciated by one of skill in the art.

Here the diode pairs 34-38 each include a first diode 34a-38a having a cathode 34a'-38a' coupled to transmission line T1 as shown. Said first diodes 34a-38a further include anodes 34a''-38a'' as shown. Anodes 34a'' and 38a'' are connected directly to ground. Anodes 36a'' is serially connected to ground through transmission line T5. Transmission lines T4 and T5 provide an additional flexibility of impedance matching to provide good input and output reflection characteristics at terminals 16a'' and 16b''. Diode pairs 34-38 further include a second diode 34b-38b having a cathode 34b'-38b' coupled to RF transmission line T1 as shown and an anode, 34b''-38b'', connected to the bias network 32 as shown. With this configuration of bias network and plurality of diode pairs, a reverse bias voltage, $V_R$, is provided to each of said plurality of diode pairs and a reference voltage, $V_{REF}$, is provided on transmission line T1. The gate 44a of field effect transistor 44 is coupled to node 16b'' via serially connected capacitor C6' as shown. As shown in FIG. 3 the amplifier 42 includes an inductor L1' coupled between a DC bias terminal VG and the gate electrode 44a of the FET 44. A capacitor C7 is coupled between the terminal VG and ground. Similarly, an inductor L2' is coupled between a DC bias terminal VD and a drain electrode 44b of the FET 44 and a DC blocking capacitor C8 is coupled between the inductor L2' and the output port 46 via a transmission line T9 as shown.

This arrangement of diodes in RF limiter 16'' eliminates the need for the tuning network 26 (FIG. 2) which is required to provide a low insertion loss characteristic in RF limiter 16' (FIG. 2), as previously discussed. The elimination of the tuning network is especially advantageous in the fabrication of an RF limiter circuit as a MMIC where it is difficult to fabricate inductors having small values of inductance. The use of a plurality of diode pairs provides advantages to fabrication of an RF limiter circuit as a MMIC while preserving and enhancing the electrical performance characteristics of a RF limiter having a single diode pair.

As is generally known, low noise amplifier 42 could optionally include an input matching network (not shown) which would match the input impedance of the FET 44 to 50 ohms at terminal 16b''. If said input matching network were used, the values of RF limiter circuit 16'' may be similar to those listed in the Table below for operation in the 35 GHz to 40 GHz frequency range.

TABLE

| ITEM | VALUE |
|---|---|
| $T_{1a}$ | Width 10 μm Length 80 μm |
| $T_{1b}$ | Width 10 μm Length 145 μm |
| $T_{1c}$ | Width 10 μm Length 145 μm |
| $T_{1d}$ | Width 10 μm Length 80 μm |
| T2, T3 | Width 20 μm Length 150 μm |
| T3 | Width 20 μm Length 150 μm |
| T4, T5 | Width 70 μm Length 185 μm |
| R1, R2 | 1000 Ohms |
| C1, C2 | 0.25 (pf) |
| C3, C4, C5 | 5.0 (pf) |

In FIG. 3 the protected device shown is a low noise amplifier 42 but could be any device requiring protection from high power signals such as, but not limited to, diodes, mixers, diplexers or any other device sensitive to input signal power.

Figure 4:
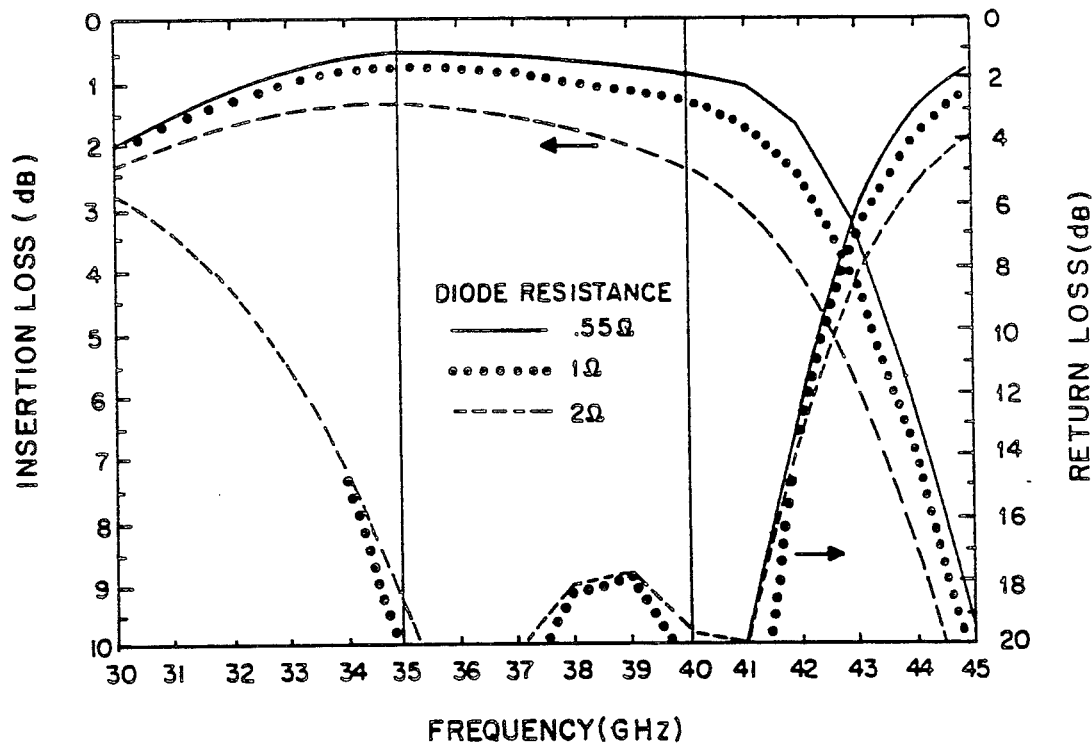
FIG. 4 is a predicted circuit response of a typical distributed RF limiter circuit of the type shown in FIG. 3.

A computer simulated design response of the RF limiter circuit 16'' (FIG. 3), is shown in FIG. 4 having the resistor, transmission line and capacitor values specified in the table. FIG. 4 was generated assuming that RF limiter circuit 16'' was terminated in real 50 ohm source and load impedances. Each insertion loss and return loss curve presented in FIG. 4 is generated using a different diode resistance as indicated in FIG. 4.

Such protected circuits as shown in FIG. 3 would be fabricated, as will be described in conjunction with FIGS. 5-15, with a preferred process for forming two monolithic microwave integrated circuit (MMIC) components from different material on a common MMIC substrate.

Figure 5:
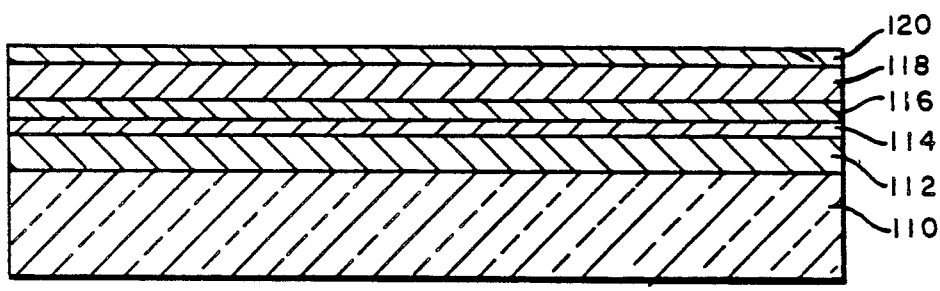
FIGS. 5-15 represent a series of cross sectional views showing the steps in fabricating a RF limiter circuit and a field effect transistor on a common substrate in accordance with the present invention.

Referring first to FIG. 5, a semiconductor substrate 110, here a semi-insulating substrate comprised of gallium arsenide or other suitable semiconductive material such as silicon or other Group III or V materials, is shown to include a plurality of layers disposed over a first surface thereof. Disposed over the first surface of substrate 110 is a first n-type active layer 112 here comprised of gallium arsenide which is suitably doped n-type by introduction of silicon to here a concentration of typically $1 \times 10^{16}$-$2 \times 10^{17}$ atoms/cc or other suitable n-type dopant for Group IV materials. Layer 112 typically has a thickness of approximately 0.3 microns. Disposed over layer 112 is a first $N^{30}$. contact layer 114 here also comprised of n-type gallium arsenide which is more heavily doped n-type by the introduction of silicon to a concentration typically of about $5 \times 10^{18}$ atoms/cc. Layer 114 has a typical thickness of approximately 0.1 microns.

Disposed over layer 114 is an etch stop layer 116 here comprised of n-type indium gallium arsenide (InGaAs) which is doped to provide a highly n-type layer with a dopant concentration of typically about $5 \times 10^{18}$ atoms/cc. Layer 116 has a thickness typically of about 80 angstroms (Å). Disposed over layer 116 is a second contact layer 118 here comprised of n-type gallium arsenide heavily doped in the range $1 \times 10^{18}$-$1 \times 10^{19}$ atoms/cc and having a thickness typically of about 0.3 microns. Disposed over layer 118 is a second active layer 120, here comprised of n-type gallium arsenide being suitably doped in the same range as layer 112 and having a thickness typically of about 0.1 microns.

Layer 112, will provide gate channels for field effect transistors and layer 114 will provide ohmic contact layers for FETS. Layer 116, here N+ InGaAs, is chosen to act as an etch stop as previously described, and will also allow for an ohmic metal contact with low specific contact resistance. The thickness of layer 118 is chosen to raise the height of the Schottky barrier metal (not shown) to be applied to the active layer 120 and will thereby prevent shorting of the self-aligned ohmic contact (not shown) as will be described in later figures. Layer 118, here N+GaAs provides contact to the active layer. Layer 120, here N GaAs will provide the active layer for diodes as will be described.

Figure 6:
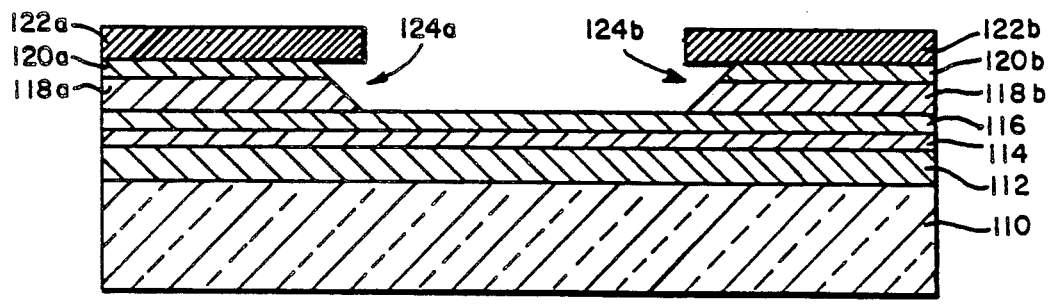

Referring now to FIG. 6, layers 118, 120 (FIG. 5) over substrate 110 are etched into a plurality of isolated mesa regions providing regions 118a, 118b, 120a, 120b as shown. Here one such region 124a is provided by depositing a conductive layer (not shown) over layer 120 (FIG. 5). The conductive layer is patterned to provide metal regions 122a and 122b. Well known techniques such as patterning the metal layer or depositing the metal layer through a photoresist (not shown) which exposes selected underlying portions of layer 120 (FIG. 5) and lifting off the photoresist as is known to leave behind the metal regions 122a and 122b may be used. Conductive layers 122a, 122b are comprised of a metal which forms a Schottky barrier contact with portions of layers 120a and 120b as shown. Here the conductive regions 122a, 122b serve as a mask while etching layers 120 (FIG. 1) and 118 (FIG. 1) to form mesa regions 124a 124b. Here the wafer is reactively ion etched using a mixture of BCl$_3$ and He vapors which attack the layers 118 and 120 in regions not covered by conductors 122a, 122b. This etchant, however, does not similarly effect the underlying layer 116. That is, here the etchant is selected to selectively etch layers 118 and 120 but not material of layer 116, here, the indium gallium arsenide. Thus, layer 116 acts as an etch stop layer when defining regions 124a, 124b.

Figure 7:
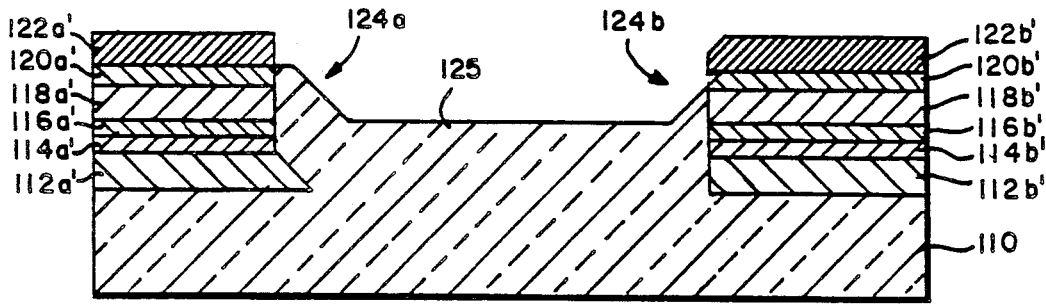

Referring now to FIG. 7, the conductor regions 122a, 122b (FIG. 6) are further etched with a process similar to that described in conjunction with FIG. 6, to create conductor regions 122a' 122b' Again using the metal regions 122a', 122b' as masks, the wafer, including a portion of mesa region 124a, is blanket implanted with a suitable impurity species at a suitable energy which will render the implanted regions 125 semi-insulating. Note, the conductive regions 122a', 122b' are used to protect the regions 112a'–120a', and 112b'–120b' from the effects of the blanket implant, leaving these regions to provide the active regions for diodes and metal electrode semiconductor field effect transistors (MESFETS).

Figure 8:
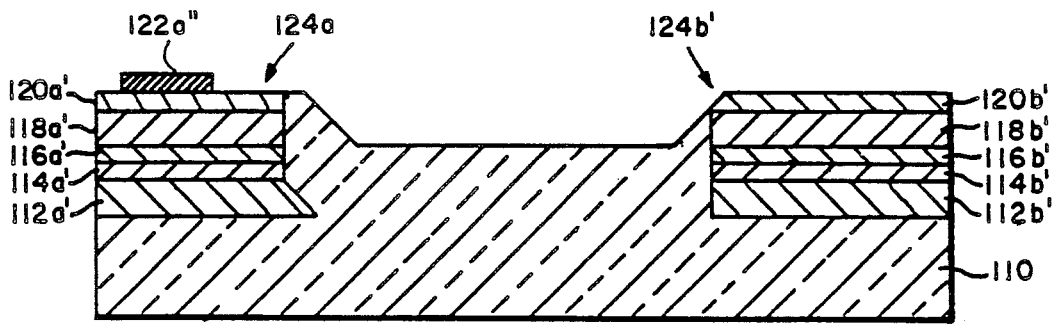

Referring now to FIG. 8, here metal region 122b' (FIG. 7) has been removed leaving region 124b'. Region 122a' (FIG. 7) has been etched to form the diode cathode 122a" on mesa region 124a. A process similar to that described in conjunction with FIG. 6 can be used to etch conductors 122a' (FIG. 7) and 122b' (FIG. 7).

Figure 9:
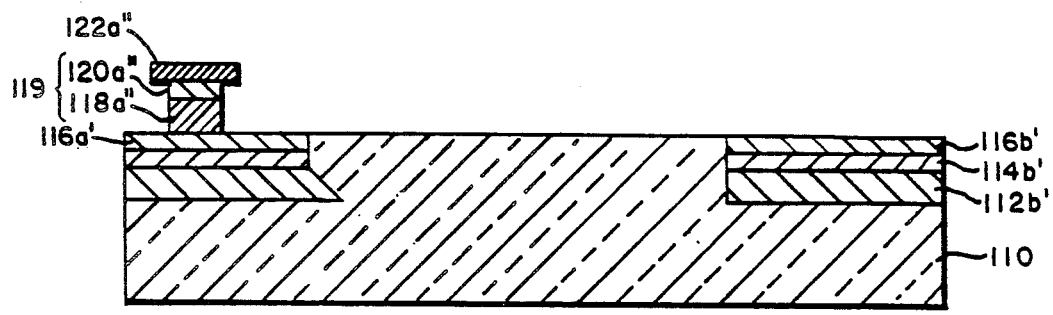

Referring now to FIG. 9, layer 120b' (FIG. 8) and 118b' (FIG. 8) are removed and layers 120a' (FIG. 8) and 118a' (FIG. 8) are etched to form regions 120a" and 118"a. Layers 120a" and 118a' together provide the diode mesa 119. Here the electrical contact 122a" serves as a self aligned mask while etching layers 118a' (FIG. 8), 120a' (FIG. 8) into regions 118a' and 120a'. Here the wafer is reactively ion etched using a mixture of BCl$_3$ and He vapors, which attack the layers 118a' (FIG. 8), 120a' (FIG. 8), 118b' (FIG. 8), 120b' (FIG. 8), in regions not covered by contact 122a". This etchant, however, does not similarly affect underlying layers 116a', 116b'.

That is, here the etchant is selected to selectively etch layers 118a' (FIG. 8), 120a' (FIG. 8), 118b' (FIG. 8), 120b' (FIG. 8) but not the material of layers 116a', 116b' here the indium gallium arsenide (InGaAs). Thus layers 116a', 116b' act as an etch stop layer when defining the mesa region 119 and exposing the underlying contact regions 116a' and 116b'. Of particular importance is the undercutting of the diode mesa 119 to ensure that the ohmic contact (not shown) which will be deposited on top of the Schottky metal 122a" does not short circuit the diode or create a leakage path or paths on the side wall of the diode mesa 119.

Figure 10:
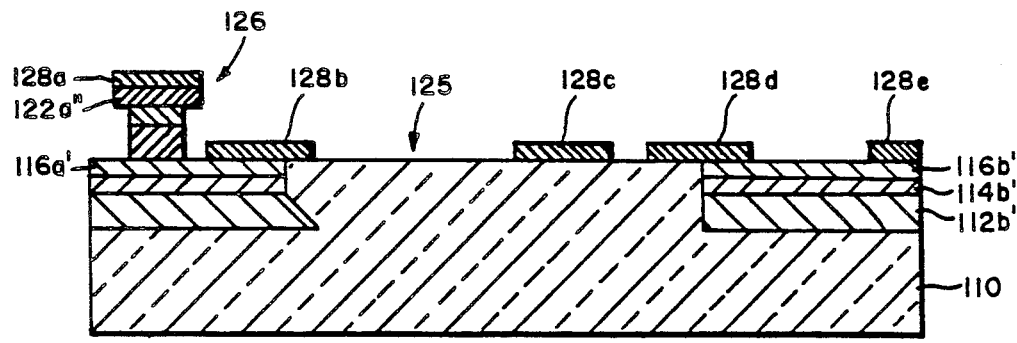

Referring now to FIG. 10, low resistivity ohmic contacts 128a, 128b, 128c, 128d, and 128e are provided over regions 116a', 116b', 122a", and 125. The ohmic contacts are provided by depositing a conductive layer (not numbered). The conductive layer is patterned using well known techniques such as depositing the layer through a photoresist layer (not shown) which exposes selected underlying portions of layers 116a' 116b', 122a" and 125 and lifting off the photoresist as is know to leave behind contacts 128a, 128b, 128c, 128d and 128e. Contact 128a forming cathode of said diode 126, contact 128b forming anode of said diode 126 and contact 128c forming a portion of a transmission line and contacts 128d, 128e forming source and drain contacts of a field effect transistor (not shown). Electrical contacts are alloyed with their underlying layers to provide low resistivity ohmic contact to their respective underlying layers. Note that it is desirable for layers 116a' and 116b', here being InGaAs, to allow for an ohmic contact with low specific contact resistance.

Figure 11:
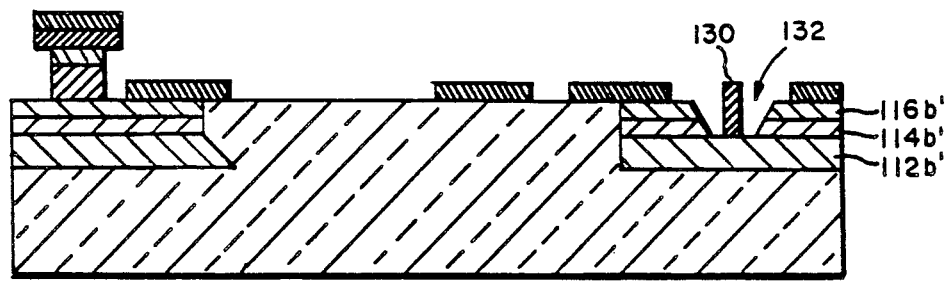

Referring now to FIG. 11, a gate electrode 130 is deposited to be in contact with layer 112b'. Prior to depositing the gate electrode, a recess 132 has been etched in layers 116b', 114b'. This is accomplished by patterning a photoresist layer (not shown) to provide an aperture (not shown) defining the gate region. After the aperture is provided in the photoresist layer, an etchant is brought into contact with the exposed gallium arsenide and the gate recess 132 is etched. Alternatively, the gate region may also be defined using electron beam lithography techniques.

Figure 12:
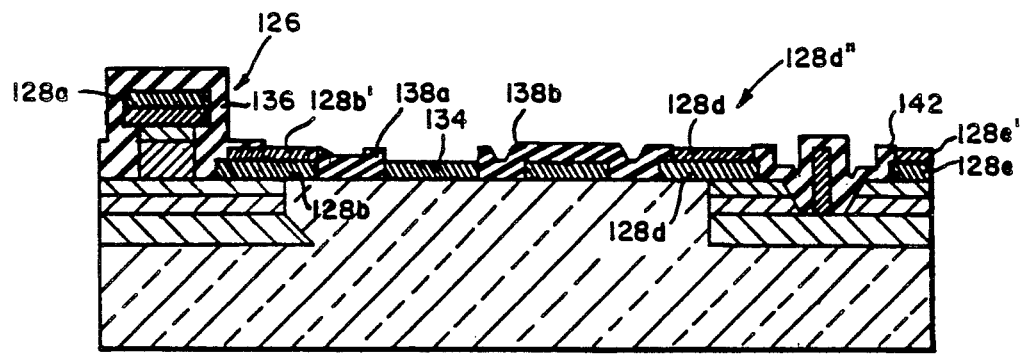

Referring now to FIG. 12, a bottom plate 134 of metal insulator metal (MIM) capacitor (not shown), thickened anode contact 128b' for diode 126 and thickened source and drain contacts 128d', 128e' for the FET (not numbered) are provided.

First, a photoresist layer (not shown) is disposed over top substrate portions and is patterned to provide regions 136, 138a, 138b and 142 which cover channel region 132 (FIG. 11) and here cathode contact 128a of diode 126. A composite layer (not shown) including a layer of metal, are sequentially evaporated over the surface of the appropriate substrate portions. Portions of the metal layer, which deposit on the photoresist layer (not shown) are removed by a subsequent lift off of the photoresist layer as is well known, whereas portions of the metal which are deposited through the patterned resist onto the appropriate substrate portions provide the bottom contact 134 of a MIM capacitor (not shown) and thickened anode contact 128b' of diode 126, as shown. Thus, a metal step is used to simultaneously thicken the contacts 128d, 128e of the FET (not numbered), provide the bottom contact 134 for the MIM capacitor (not shown) and provide thickened anode contact 128b for diode 126. The drain and source electrodes 128d, 128e of the FET and the anode contact 128b of the diode 126 are generally thickened in order to increase the current carrying capability of the contact by reducing electromigration which is caused by excessive current passing through the contacts.

Figure 13:
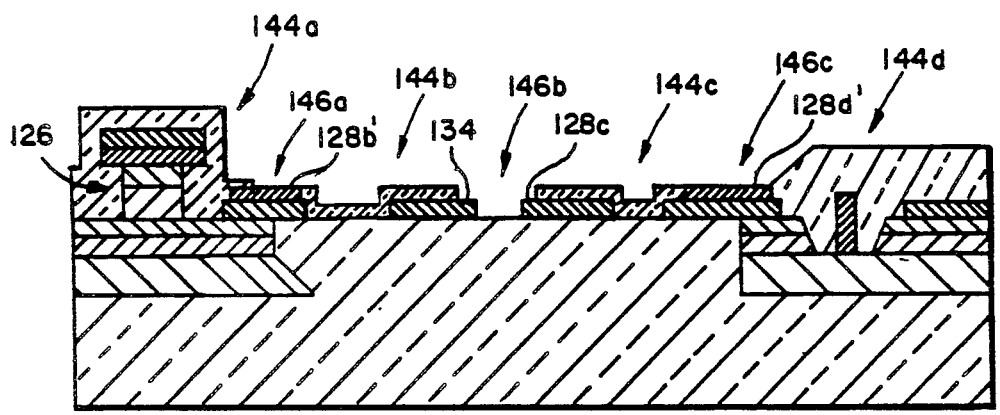

Referring now to FIG. 13, a passivation layer 144a-144c and optionally 144d is disposed over the top surface of the gallium arsenide substrate as shown to a thickness of typically 2000 angstroms. The passivation layer, generally referred to as layer 144, is here silicon nitride ($Si_3N_4$) provided by a plasma enhanced chemical vapor deposition technique. The silicon nitride serves to conformally cover the surface of the wafer, to provide passivation, and also serves as the dielectric for MIM capacitors. Now the passivation layer 144 is covered with a layer of photoresist (not shown). The layer of photoresist is then patterned to provide apertures 146a, 146b and 146c which expose portions underlying passivation layer 144. Here said apertures 146a-146c being disposed over the thickened source contact 128d' of the FET (not numbered), thickened anode contact 128b' of the RF limiter circuit diode, capacitor bottom plate 134 and RF transmission line 128c as required to access conductors. These apertures are provided through the silicon nitride passivation layer by using a reactive ion etch, as is generally known. Thus, after removal of the masking layer (not shown) a portion of the anode contact 128b' of the diode 126 is exposed via aperture 146a and portions of the bottom capacitor metal 134 and transmission line 128c are exposed via aperture 146b and thickened source contact 128d', of the FET (not numbered) is exposed via aperture 146c as shown.

Figure 14:
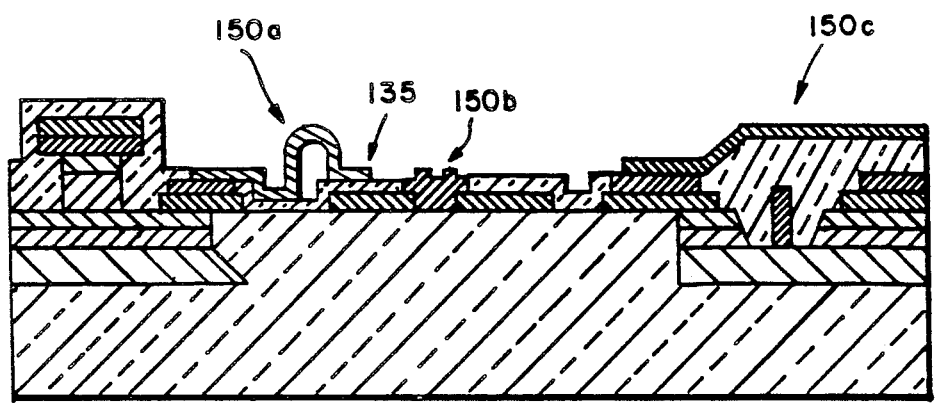

Referring now to FIG. 14, air bridge 150a, interconnect 150b and source interconnect 150c are provided. First, transmission line 128c and the bottom electrode 134 (FIG. 13) of the MIM capacitor 135, are interconnected with a 3 micron thick gold metalization layer, which serves as the strip conductor for a low-loss microwave microstrip transmission line 150b. The process used to provide the thick metal interconnects is first provided by forming resist spacer layers (not shown) over regions where air bridges will be provided. After the spacers have been defined, a photoresist layer (not shown) is used to define patterns for the air bridge interconnect 150a and source electrode interconnect 150c. Metal is deposited through said pattern layers and over the air bridge resist spacers (not shown) to provide the air bridge structure 150a and source transmission line 150c as shown in FIG. 14. Techniques as described in U.S. Pat. No. 4,670,297 assigned to the assignee of the present invention may be used to provide the air bridges, for example.

Figure 15:
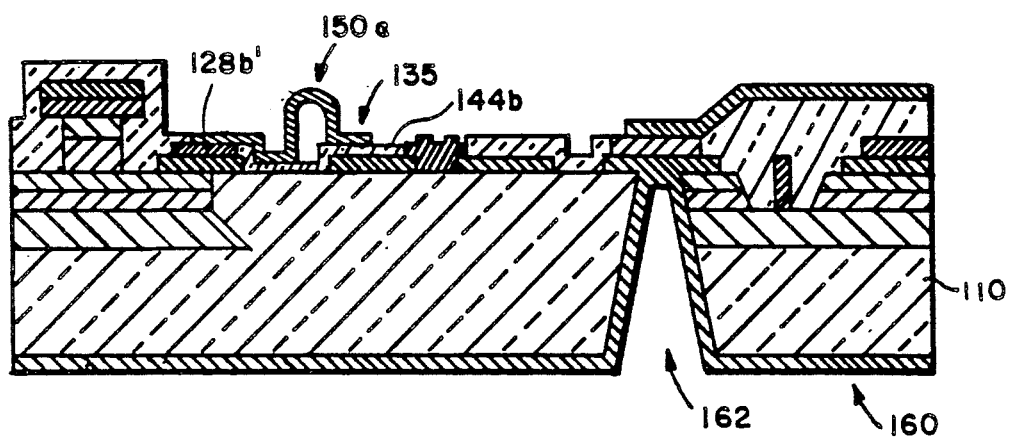

Referring now to FIG. 15, backside processing of substrate 110 is provided to form plated vias 162 to interconnect the source electrode of the FET to a ground plane conductor 160, as shown. Here conventional techniques are used, such as those described in U.S. Pat. No. 4,807,022 by Kazior, et al. and assigned to the assignee of the present invention or U.S. Pat. No. 4,794,093 by Tong et al. and assigned to the assignee of the present invention. In particular, the above mentioned patents provide techniques for forming via holes and plated tub structures and would be particularly desirable for those circuits which incorporate high-power dissipation elements, such as high power transistors to provide low thermal impedance paths between the transistors and the ground plane conductor 160. Here, it would be desirable for the RF limiter circuit to incorporate such a ground structure.

It should be appreciated that what has been described above is the general processing to form circuit components, or combination circuits commonly encountered in microwave and microwave and millimeter wave monolithic integrated circuits (MMICs and MIM-MICs). The above process did not describe any particular circuit, but can be used to provide all the circuits described in conjunction with FIGS. 1-3 and FIG. 5, as well as other circuits using multiple monolithic microwave integrated circuit components on a common semiconductor substrate.

Figure 16:
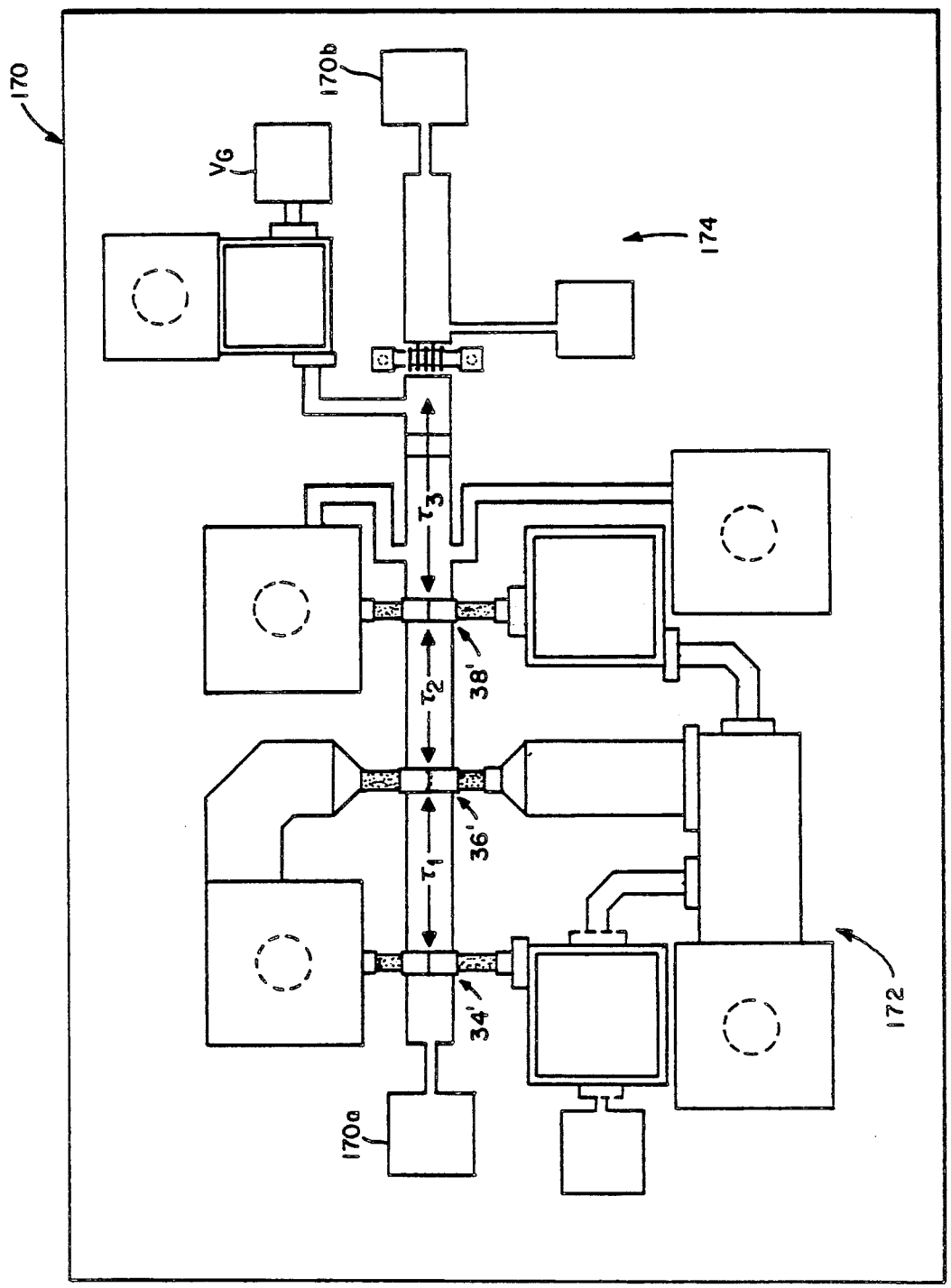
FIG. 16 is a plan view of a protected field effect transistor.

Referring now to FIG. 16, an RF limiter protected field effect transistor fabricated as a monolithic microwave integrated circuit 170 has an input terminal 170a, an output terminal 170b, an RF limiter circuit 172 and a low noise amplifier 174. RF limiter circuit 172 includes three diode pairs 34', 36', 38' corresponding to diode pairs 34, 36, 38 (FIG. 3). It should be noted that the line lengths $\tau_1$, $\tau_2$, between diode pairs, 34', 36', 38', in addition to line length $\tau_3$ between RF limiter circuit 172 and the field effect transistor 176, have been chosen to provide selected input and output impedances at terminals 170a and 170b as would be appreciated by one of skill in the art.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A limiter circuit having an input terminal and an output terminal comprising:

an RF propagation network having a first end coupled to the input terminal of the circuit and a second end coupled to the output terminal of the circuit;

a plurality of diodes, each diode having an anode and a cathode with a first one of the anode and the cathode of a first one of said diodes coupled to said RF propagation network at a node and a second different one of the anode and the cathode of a second one of said diodes coupled to said RF propagation network at the node; and means for distributing a reverse bias voltage across each of said plurality of diodes, for providing and maintaining each of said diodes in their reverse biased state and for providing a DC voltage on said RF propagation network.

2. The limiter of claim 1 further comprising:
a tuning network coupled to said RF propagation network.

3. The limiter of claim 2 wherein said tuning network comprises:

an inductor having a first electrode coupled to said RF propagation network and having a second electrode; and a capacitor having a first electrode coupled to the second electrode of said inductor and a second electrode coupled to a first reference potential.

4. The limiter of claim 2 further comprising:
a first capacitor serially connected between the input terminal and the first end of the RF propagation network; and
a second capacitor serially connected between the second end of the said RF propagation network and said output terminal.

5. The limiter of claim 4 wherein said plurality of diodes are Schottky barrier diodes.

6. The limiter of claim 4 wherein said plurality of diodes are PN junction diodes.

7. An RF circuit having an input terminal and an output terminal comprising:
   an RF propagation network having a first end coupled to the input terminal of the circuit and a second end coupled to the output terminal of the circuit;
   a plurality of diode pairs, each diode of said plurality of diode pairs comprising:
   a first diode having an anode and a cathode with a first one of the anode and cathode of said first diode coupled to said RF propagation network at a node; and
   a second diode having a second different one of the anode and the cathode of said second diode coupled to said RF propagation network; and
   means for distributing a reverse bias voltage across each of said plurality of diode pairs, for providing and maintaining each of said diodes in their reverse biased state and for providing a DC voltage on said RF propagation network.

8. The RF circuit as recited in claim 7 further comprising:
   at least one capacitor serially connected between said input terminal and said first end of said RF propagation network; and
   at least one second different capacitor serially connected between the second end of said RF propagation network and said output terminal.

9. The RF circuit as recited in claim 8 wherein said plurality of diode pairs are Schottky barrier diodes.

10. The RF circuit as recited in claim 8 wherein said plurality of diodes are PN junction diodes.

11. An RF limiter circuit having an input terminal and an output terminal comprising:
    an RF propagation network having a first end coupled to the input terminal of the circuit and a second end coupled to the output terminal of the circuit;
    a plurality of diode pairs each of said diode pairs spaced at a predetermined pathlength along said RF propagation network and each of said diode pairs comprising:
    a first diode having a first electrode and a second electrode with the first electrode of said first diode coupled to said RF propagation network at a node; and
    a second diode having a first electrode and a second electrode with the second electrode of said second diode coupled to said RF propagation network at the node; and
    means for distributing a reverse bias voltage across each of said plurality of diode paris and for providing a DC voltage on said RF propagation network.

12. The limiter as recited in claim 11 further comprising:
    at least one capacitor serially connected between said input terminal and said first end of said RF propagation network; and
    at least one second different capacitor serially connected between the second end of said RF propagation network and said output terminal.

13. The limiter as recited in claim 12 wherein said plurality of diode pairs are Schottky Barrier diodes.

14. The RF limiter of claim 13 wherein said means for distributing a reverse bias voltage further comprises:
    means for providing and maintaining each diode of said diode pair in its reverse biased state.

15. The RF limiter of claim 14 further comprising:
    a field effect transistor having a gate electrode coupled to the second end of the RF propagation network.

16. The RF limiter of claim 15 wherein said first electrodes correspond to anodes and said second electrodes correspond to cathodes.

17. The RF limiter of claim 15 wherein said first electrodes correspond to cathodes and said second electrodes correspond to anodes.

* * * * *